United States Patent
Chen

(10) Patent No.: US 10,396,264 B2
(45) Date of Patent: Aug. 27, 2019

(54) ELECTRONIC MODULE AND METHOD FOR MANUFACTURING THE SAME, AND THERMOELECTRIC DEVICE INCLUDING THE SAME

(71) Applicant: Advanced Semiconductor Engineering, Inc., Kaohsiung (TW)

(72) Inventor: Jenchun Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/347,658

(22) Filed: Nov. 9, 2016

(65) Prior Publication Data

US 2018/0130937 A1 May 10, 2018

(51) Int. Cl.
 *H01L 35/32* (2006.01)
 *H01L 35/34* (2006.01)
 *H01L 23/38* (2006.01)
 *H01L 23/373* (2006.01)

(52) U.S. Cl.
 CPC .............. *H01L 35/32* (2013.01); *H01L 23/38* (2013.01); *H01L 35/34* (2013.01); *H01L 23/3736* (2013.01)

(58) Field of Classification Search
 CPC ................................ H01L 35/10; H01L 35/32
 See application file for complete search history.

(56) References Cited

U.S. PATENT DOCUMENTS

| 3,022,360 | A | * | 2/1962 | Pietsch | H01L 35/08 136/203 |
| 5,064,476 | A | * | 11/1991 | Recine, Sr. | F25B 21/02 136/200 |
| 6,034,317 | A | * | 3/2000 | Watanabe | H01L 35/30 136/201 |
| 6,121,539 | A | * | 9/2000 | Johnson | H01L 23/38 136/203 |
| 8,803,212 | B2 | | 8/2014 | Cho | |
| 2005/0016183 | A1 | * | 1/2005 | Tateyama | H01L 35/06 62/3.7 |
| 2006/0185710 | A1 | * | 8/2006 | Yang | H01L 35/16 136/205 |
| 2010/0193003 | A1 | | 8/2010 | Lee et al. | |
| 2014/0252531 | A1 | * | 9/2014 | Aryan | H01L 35/32 257/467 |
| 2014/0338716 | A1 | * | 11/2014 | Nakajima | H01L 35/32 136/212 |
| 2015/0325772 | A1 | | 11/2015 | Boukai et al. | |
| 2016/0260883 | A1 | * | 9/2016 | Yonekura | H01L 35/24 |

FOREIGN PATENT DOCUMENTS

JP WO 2015098574 A1 * 7/2015 ............. H01L 35/24

* cited by examiner

*Primary Examiner* — Eli S Mekhlin
(74) *Attorney, Agent, or Firm* — Foley & Lardner LLP; Cliff Z. Liu

(57) ABSTRACT

An electronic module includes a first base layer and at least one via. The first base layer has a first surface and a second surface opposite the first surface, and defines at least one first hole. The first base layer includes a first metal. The via is disposed in the first hole of the first base layer. The via includes a thermoelectric material. A value of Z×T for the thermoelectric material is greater than a value of Z×T for the first metal, wherein Z is a thermoelectric figure of merit, T is temperature (in K), and the value of Z×T for the thermoelectric material is greater than 0.5.

19 Claims, 14 Drawing Sheets

ELECTRONIC MODULE AND METHOD FOR MANUFACTURING THE SAME, AND THERMOELECTRIC DEVICE INCLUDING THE SAME

BACKGROUND

1. Field of the Disclosure

The present disclosure relates to an electronic module, a thermoelectric device and a method for manufacturing an electronic module, and more particularly to an electronic module and a thermoelectric device for active cooling and a method for manufacturing the same.

2. Description of the Related Art

A design of an electronic device, such as automotive vehicle electronic device, wearable electronic device, or electronic device in a computer, specifies high speed data transmission, high capacity and a small size. Heat dissipation is also an important issue for such an electronic device. During operation, high speed data transmission can result in a significant amount of heat being generated and can raise a temperature of the electronic device, and due to the small size it can be difficult to dissipate heat. If the heat is not dissipated efficiently, the performance of the electronic device can be lowered, or the electronic device may break down or be rendered inoperative.

SUMMARY

In one aspect according to some embodiments, an electronic module includes a first base layer and at least one via. The first base layer has a first surface and a second surface opposite the first surface, and defines at least one first hole. The first base layer includes a first metal. The via is disposed in the first hole of the first base layer. The via includes a thermoelectric material. A value of Z×T for the thermoelectric material is greater than a value of Z×T for the first metal, wherein Z is a thermoelectric figure of merit, T is temperature in Kelvin (K), and the value of Z×T for the thermoelectric material is greater than 0.5.

In another aspect according to some embodiments, a thermoelectric device includes a direct current voltage source, a first base layer, a second base layer and at least one via. The direct current voltage source has a positive connection and a negative connection. The first base layer is electrically connected to the negative connection of the direct current voltage source, and is located in a first temperature region. The second base layer is electrically connected to the positive connection of the direct current voltage source, and is located in a second temperature region. A first temperature of the first temperature region is lower than a second temperature of the second temperature region. The via contacts the first base layer and the second base layer, wherein the via includes a thermoelectric material. A value of Z×T for the thermoelectric material is greater than 0.5, wherein Z is a thermoelectric figure of merit, and T is temperature in K.

In another aspect according to some embodiments, a method of manufacturing an electronic module includes: (a) forming a first base layer; (b) forming a second base layer; (c) attaching the first base layer and the second base layer, the second base layer is electrically insulated from the first base layer; and (d) forming at least one via to contact the first base layer and the second base layer.

DETAILED DESCRIPTION

The present disclosure describes embodiments of an improved thermoelectric device and improved techniques for manufacturing the thermoelectric device. Some embodiments of the thermoelectric device include an electronic module including at least one via with a thermoelectric material disposed therein. The thermoelectric device and techniques of the present disclosure are suitable, for example, for active heat dissipation.

In general, heat dissipation is typically achieved by a metal plate or other heat sink (e.g., a stainless steel plate or an aluminum alloy plate) attached to an electronic device, such as automotive vehicle electronic device, wearable electronic device, or electronic device in a computer. The heat generated by the electronic device is dissipated by the conductivity of the metal plate. Such heat dissipation is passive, and the efficiency of such heat dissipation is poor. To address these concerns, plural fin type heat sinks can be used. Plural fin type heat sinks are designed to have a plurality of surfaces to dissipate heat. However, the efficiency of heat dissipation of the fin type heat sink is still poor. In addition, it can be difficult to reduce a size of the fin type heat sink.

To address at least the above concerns, the present disclosure describes an improved thermoelectric device. The thermoelectric device includes an electronic module including a base layer and at least one via. The base layer includes a metal material and defines at least one hole, and the at least one via is disposed in the respective hole of the base layer. The via includes a thermoelectric material. A value of Z×T for the thermoelectric material is greater than a value of Z×T for the metal material of the base layer, wherein Z is a thermoelectric figure of merit (in 1/K), T is temperature (in K), Z×T is a dimensionless thermoelectric figure of merit, and the value of Z×T for the thermoelectric material is greater than about 0.5. By selecting a specific material of the thermoelectric material and electrically connecting the electronic module to a direct current source, the thermoelectric device can be used as a heat bump with active heat dissipation, and is capable of dissipating heat from a high temperature end to a low temperature end through the via according to thermoelectric effect. Thus, highly efficient heat dissipation can be achieved. Additionally, the size of the thermoelectric device or the electronic module can be reduced efficiently.

Figure 1:
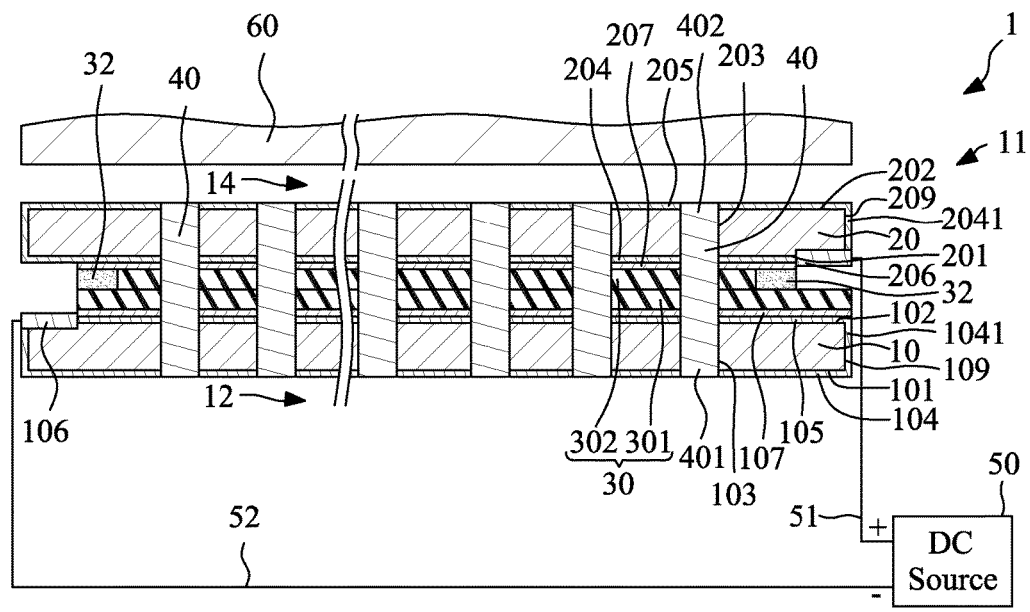
FIG. 1 illustrates a cross-sectional view of a thermoelectric device according to an embodiment of the present disclosure.
Figure 2:
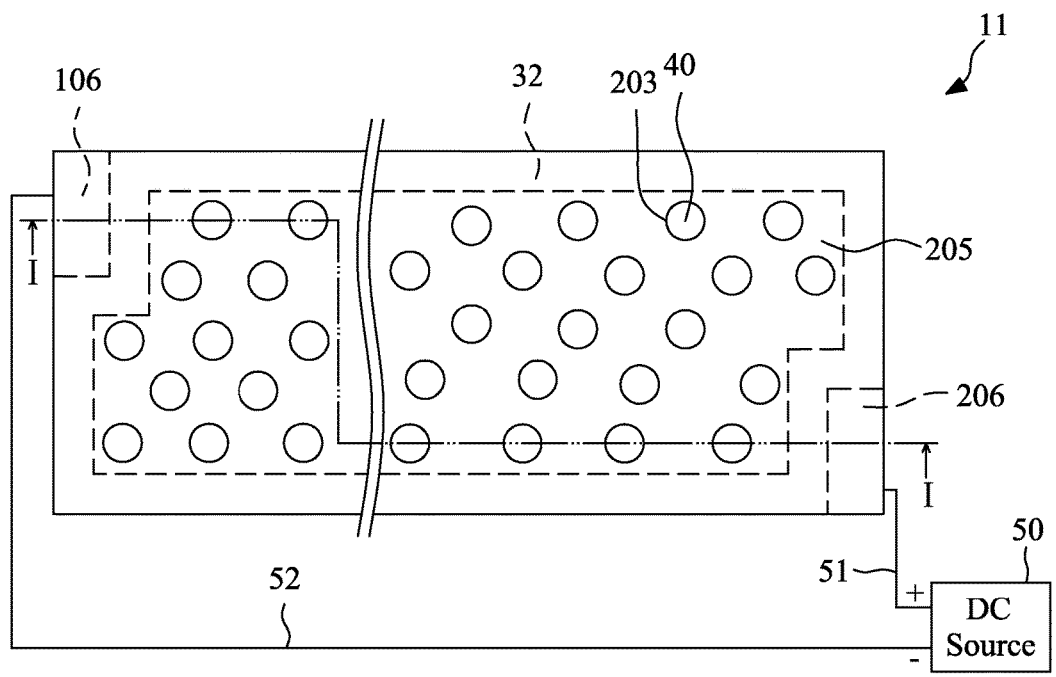
FIG. 2 illustrates a top view of an electronic module of FIG. 1 according to an embodiment of the present disclosure.

FIG. 1 illustrates a cross-sectional view of a thermoelectric device 1 according to an embodiment of the present disclosure. FIG. 2 illustrates a top view of an electronic module 11 of FIG. 1 according to an embodiment of the present disclosure. It is noted that FIG. 1 is the cross-sectional view taken along line I-I of FIG. 2. The thermoelectric device 1 includes a direct current voltage source 50, an electronic module 11 and an electrical element 60. The direct current voltage source 50 has a positive connection 51 and a negative connection 52. The electronic module 11 is electrically connected to the positive connection 51 and to the negative connection 52. The electrical element 60 may be, for example, one of the above-mentioned electronic devices such as automotive vehicle electronic device, wearable electronic device, or electronic device in a computer, and is disposed adjacent to or in thermal contact with the electronic module 11, such that the electronic module 11 can dissipate heat from the electrical element 60 to the lower temperature region according to the thermoelectric effect. It is noted that in some embodiments the electrical element 60 may be also electrically connected to the direct current voltage source 50. That is, the electronic module 11 and the electrical element 60 may use the same power source.

The electronic module 11 includes a first base layer 10, a second base layer 20, at least one via 40, a first oxide layer 104, a second oxide layer 105, a side oxide layer 1041, an insulation layer 30, a third oxide layer 204, a fourth oxide layer 205, a side oxide layer 2041, a first electric terminal 106, a second electric terminal 206 and an adhesion frame 32. The first base layer 10 has a first surface 101, a second surface 102 opposite to the first surface 101 and a side surface 109, and defines at least one first hole 103 extending through the first base layer 10. The first base layer 10 includes a first metal. In one or more embodiments, the first metal may be, for example, copper, aluminum or other suitable metal. The first base layer 10 is electrically connected to the negative connection 52 of the direct current voltage source 50 via the first electric terminal 106, and is located in a first temperature region 12. The first temperature region 12 can be coextensive with at least a portion of the first base layer 10. The first temperature region 12 can be approximately coextensive with the first base layer 10. The first base layer 10 may, for example, be manufactured by casting, or the first base layer 10 may, for example, be formed from a metal foil. Thus, the thickness of the first base layer 10 can be in a range of about 0.1 mm (millimeters) to about 0.5 mm, which is thinner than a conventional heat sink.

The second base layer 20 has a first surface 201, a second surface 202 opposite to the first surface 201 and a side surface 209, and defines at least one second hole 203 extending through the second base layer 20. The second hole 203 of the second base layer 20 is aligned with the first hole 103 of the first base layer 10. The second base layer 20 includes a second metal. In one or more embodiments, the second metal may be, for example, copper, aluminum or other suitable metal. The second metal may be the same as the first metal, that is, the material of the second base layer 20 may be the same as the material of the first base layer 10. As shown in FIG. 1, the first surface 201 of the second base layer 20 faces the second surface 102 of the first base layer 10, and the second base layer 20 is electrically insulated from the first base layer 10 by the insulation layer 30. The second base layer 20 is electrically connected to the positive connection 51 of the direct current voltage source 50 via the second electric terminal 206, and is located in a second temperature region 14. The second temperature region 14 can be coextensive with at least a portion of the second base layer 20. The second temperature region can be approximately coextensive with the second base layer 20. A first temperature of the first temperature region 12 is lower than a second temperature of the second temperature region 14. The first temperature can be an average temperature of the first temperature region 12, and the second temperature can be an average temperature of the second temperature region 14. The second base layer 20 may, for example, be manufactured by casting, or the second base layer 20 may, for example, be formed from a metal foil. Thus, the thickness of the second base layer 20 can be in a range of about 0.1 mm to about 0.5 mm, which is thinner than the conventional heat sink. The second base layer 20 and the first base layer 10 may be formed by the same method, and the thickness of the second base layer 20 may be the same as the thickness of the first base layer 10.

The first oxide layer 104 is formed on the first surface 101 of the first base layer 10, the second oxide layer 105 is formed on the second surface 102 of the first base layer 10, and the side oxide layer 1041 is formed on the side surface 109 of the first base layer 10. In one or more embodiments, the first oxide layer 104, the second oxide layer 105 and the side oxide layer 1041 may be omitted. The third oxide layer 204 is formed on the first surface 201 of the second base layer 20, the fourth oxide layer 205 is formed on the second surface 202 of the second base layer 20 and the side oxide layer 2041 is formed on the side surface 209 of the second base layer 20. In one or more embodiments, the third oxide layer 204, the fourth oxide layer 205 and the side oxide layer 2041 may be omitted.

The insulation layer 30 is disposed in between the first base layer 10 and the second base layer 20. In the embodiment illustrated in FIG. 1, the insulation layer 30 is sandwiched between the second oxide layer 105 and the third oxide layer 204. The insulation layer 30 includes a first insulation layer 301 and a second insulation layer 302, wherein the first insulation layer 301 is attached to the second oxide layer 105 by a first coupling agent 107, and the second insulation layer 302 is attached to the third oxide layer 204 by a second coupling agent 207. The first coupling agent 107 is used to facilitate bonding between the first insulation layer 301 and the second oxide layer 105, and the second coupling agent 207 is used to facilitate bonding between the second insulation layer 302 and the third oxide layer 204. The material of the first coupling agent 107 and the second coupling agent 207 may include, for example, a siloxane coupling agent or other suitable material. The material of the first insulation layer 301 and the second insulation layer 302 may include, for example, polyimide (PI), polyphenylene oxide (PPO) or other suitable material, such that the second base layer 20 is electrically insulated from the first base layer 10. The material of the first insulation layer 301 may include the same as or different from the material of the second insulation layer 302. The thickness of the first insulation layer 301 may be approximately the same as the thickness of the second insulation layer 302. Both the thickness of the first insulation layer 301 and the thickness of the second insulation layer 302 can be in a range of about 20 µm to about 100 µm. The thickness of the first insulation layer 301 may be different from the thickness of the second insulation layer 302.

As shown in FIG. 1, the first insulation layer 301 contacts the second insulation layer 302, and a boundary is formed therebetween. However, in at least one embodiment, the first insulation layer 301 and the second insulation layer 302 are melted together, and there is no boundary formed therebetween. In at least one embodiment, the first insulation layer 301 and the second insulation layer 302 can be formed integrally. It is noted that the first insulation layer 301 and/or the second insulation layer 302 may be omitted.

At least one via 40 is disposed in a respective first hole 103 of the first base layer 10 and a respective second hole 203 of the second base layer 20. That is, the via 40 extends through the first base layer 10 and the second base layer 20. Further, the via 40 also extends through the first oxide layer 104, the second oxide layer 105, the first coupling agent 107, the first insulation layer 301, the second insulation layer 302, the second coupling agent 207, the third oxide layer 204 and the fourth oxide layer 205. In at least one embodiment, the via 40 is a substantially solid cylindrical structure. The first end 401 of the via 40 is disposed in the first hole 103 of the first base layer 10 so that the via 40 contacts the first base layer 10 directly, and the via 40 is electrically connected to the first base layer 10. The second end 402 of the via 40 is disposed in the second hole 203 of the second base layer 20 so that the via 40 contacts the second base layer 20 directly, and the via 40 is electrically connected to the second base layer 20. As shown in FIG. 1, the first end 401 and the second end 402 of the via 40 are exposed from the first oxide layer 104 and the fourth oxide layer 205 respectively. As shown in FIG. 2, the electronic module 11 can include a plurality of vias 40. The vias 40 may be distributed in any appropriate fashion, such as randomly, or in an array.

The via 40 includes a thermoelectric material. A value of Z×T for the thermoelectric material is greater than a value of Z×T for the first metal of the first base layer 10 and the second metal of the second base layer 20, wherein Z is a thermoelectric figure of merit, T is temperature (in K). Further, the value of Z×T for the thermoelectric material is greater than about 0.5, such as about 0.6 or greater, about 0.8 or greater, about 1 or greater, or about 1.2 or greater. In at least one embodiment, the thermoelectric material can include, for example, one or any combination of sodium cobaltate (e.g., $Na_xCo_2O_4$), ZrNiSn, $Bi_2Sr_2Co_2O_y$, $Ca_2Co_2O_5$, $Ca_3Co_4O_9$, bismuth antimony telluride (e.g., $Bi_xSb_{2-x}Te_3$), a MgAgSb based material, $CsBi_4Te_4$ or other suitable materials. It is noted that the value of Z×T for the thermoelectric material can be greater than about five times, about seven times, about ten times, or a larger number times the value of Z×T for the first metal of the first base layer 10 and the second metal of the second base layer 20. The value of Z×T for the thermoelectric material can be high, such that the thermoelectric material can exhibit a significant thermoelectric effect.

The first electric terminal 106 can be disposed on the first base layer 10. In one or more embodiments, the first electric terminal 106 may be disposed adjacent to the first surface 101 or the second surface 102 of the first base layer 10. The first electric terminal 106 may be formed by removing a portion of the first oxide layer 104 or the second oxide layer 105 so as to expose the first base layer 10, and then the first electric terminal 106 can be plated on the exposed portion of the first base layer 10 directly. The second electric terminal 206 can be disposed on the second base layer 20. In one or more embodiments, the second electric terminal 206 may be disposed adjacent to the first surface 201 or the second surface 202 of the second base layer 20. The second electric terminal 206 may be formed by removing a portion of the third oxide layer 204 or the fourth oxide layer 205 so as to expose the second base layer 20, and then the second electric terminal 206 can be plated on the exposed portion of the second base layer 20 directly. A material included in the first electric terminal 106 or the second electric terminal 206 may be copper. The first electric terminal 106 and the second electric terminal 206 are electrically connected to the negative connection 52 and the positive connection 51 of the direct current source 50, respectively. As shown in FIG. 1, the first insulation layer 301 does not cover the first electric terminal 106; however, in other embodiment, the first insulation layer 301 may cover a portion of the first electric terminal 106.

The adhesion frame 32 is disposed adjacent to the first surface 201 of the second base layer 20 and adhered to the first insulation layer 301. The adhesion frame 32 is disposed at the periphery of the second base layer 20, surrounds the second insulation layer 302 and does not cover the second electric terminal 206 and the first electric terminal 106. In at least one embodiment, the thickness of the adhesion frame 32 is substantially the same as the thickness of the second insulation layer 302. As shown in FIG. 2, the adhesion frame 32 is a continuous loop; however, in other embodiment, the adhesion frame 32 may be discontinuous. In at least one embodiment, the adhesion frame 32 is cured from an ultraviolet (UV) curable adhesive or other suitable material.

The thermoelectric device 1 can operate as follows. The electrical element 60 generates a significant amount of heat during operation such that the temperature of the second temperature region 14, which is near the electrical element 60, is higher than the temperature of the first temperature region 12, which is further away from the electrical element 60 than is the second temperature region 14. The thermoelectric device 1 is disposed near or contacts the electrical element 60, and the fourth oxide layer 205 faces the electrical element 60 so that the second base layer 20 is located in the second temperature region 14 and the first base layer 10 is located in the first temperature region 12. When the direct current voltage source 50 is turned on, the voltage of the second end 402 of the via 40 is higher than the voltage of the first end 401 of the via 40. The second end 402 of the via 40 will absorb heat in the second temperature region 14 due to the thermoelectric effect, and the heat will be transmitted through the via 40 to the first end 401 of the via 40, and then the heat will be dissipated to the first temperature region 12 through the first end 401 of the via 40. This process can proceed in a continuous fashion such that heat is continuously dissipated. Thus the thermoelectric device 1 can be used as a heat bump performing active heat dissipation, and can dissipate the heat from the electrical element 60 to, for example, a low temperature atmosphere through the via(s) 40. Thus, the heat dissipation is highly efficient. In addition, because the thermoelectric device 1 does not need to have a large number of surfaces to dissipate heat, and because the first base layer 10 and the second base layer 20 can be designed to be thin plates, the size of the thermoelectric device 1 or the electronic module 11 can be efficiently reduced.

Figure 3:
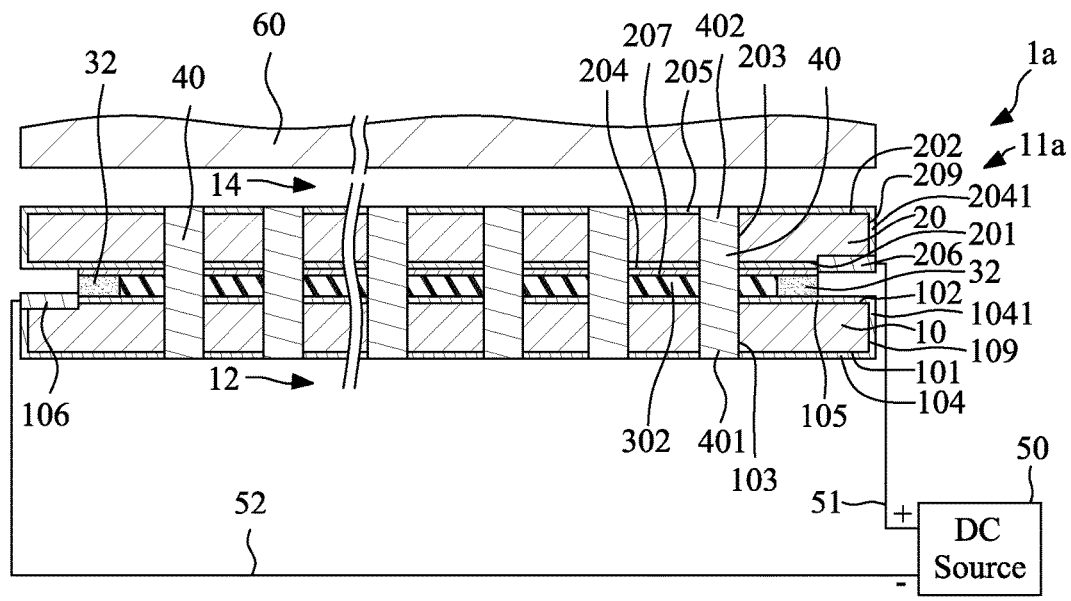
FIG. 3 illustrates a cross-sectional view of a thermoelectric device according to an embodiment of the present disclosure.

FIG. 3 illustrates a cross-sectional view of a thermoelectric device 1a according to an embodiment of the present disclosure. The thermoelectric device 1a is similar in some ways to the thermoelectric device 1 as shown in FIG. 1, but differs at least in the structure of the electronic module 11a. The electronic module 11a is similar to the electronic module 11 as shown in FIG. 1, but differs in at least the following way. The electronic module 11a does not include the first coupling agent 107 and the first insulation layer 301. Thus, the second insulation layer 302 contacts the second oxide layer 105, and the adhesion frame 32 is adhered to the second oxide layer 105 directly.

Figure 4:
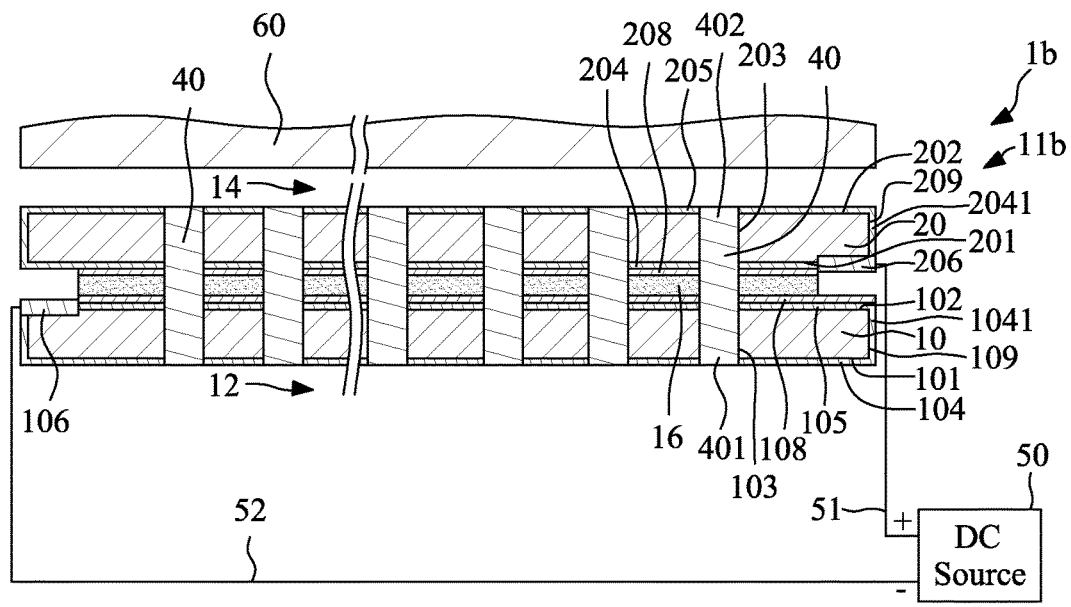
FIG. 4 illustrates a cross-sectional view of a thermoelectric device according to an embodiment of the present disclosure.

FIG. 4 illustrates a cross-sectional view of a thermoelectric device 1b according to an embodiment of the present disclosure. The thermoelectric device 1b is similar in some ways to the thermoelectric device 1 as shown in FIG. 1, but differs at least in the structure of the electronic module 11b. The electronic module 11b is similar to the electronic module 11 as shown in FIG. 1, but differs in at least the following way. The electronic module 11b includes a first dielectric layer 108, a second dielectric layer 208 and an adhesion layer 16, which replace the first coupling agent 107, the first insulation layer 301, the second insulation layer 302, the second coupling agent 207 and the adhesion frame 32. The first dielectric layer 108 is disposed on the second oxide layer 105, and the second dielectric layer 208 is disposed on the third oxide layer 204. The materials of the first dielectric layer 108 and the second dielectric layer 208 include, for example, silicon carbide (SiC) or other suitable material. The material of the first dielectric layer 108 may be the same as or different than the material of the second dielectric layer 208. The thickness of the first dielectric layer 108 and the second dielectric layer 208 may be in a range of about 10 μm (micrometers) to about 20 μm. The first dielectric layer 108 is bonded to the second dielectric layer 208 by the adhesion layer 16. That is, the adhesion layer 16 is sandwiched between the first dielectric layer 108 and the second dielectric layer 208. The material of the adhesion layer 16 may include a coupling agent (e.g., siloxane coupling agent) or other suitable material. In at least one embodiment, the adhesion layer 16 may cover the first electric terminal 106 and the second electric terminal 206.

Figure 5:
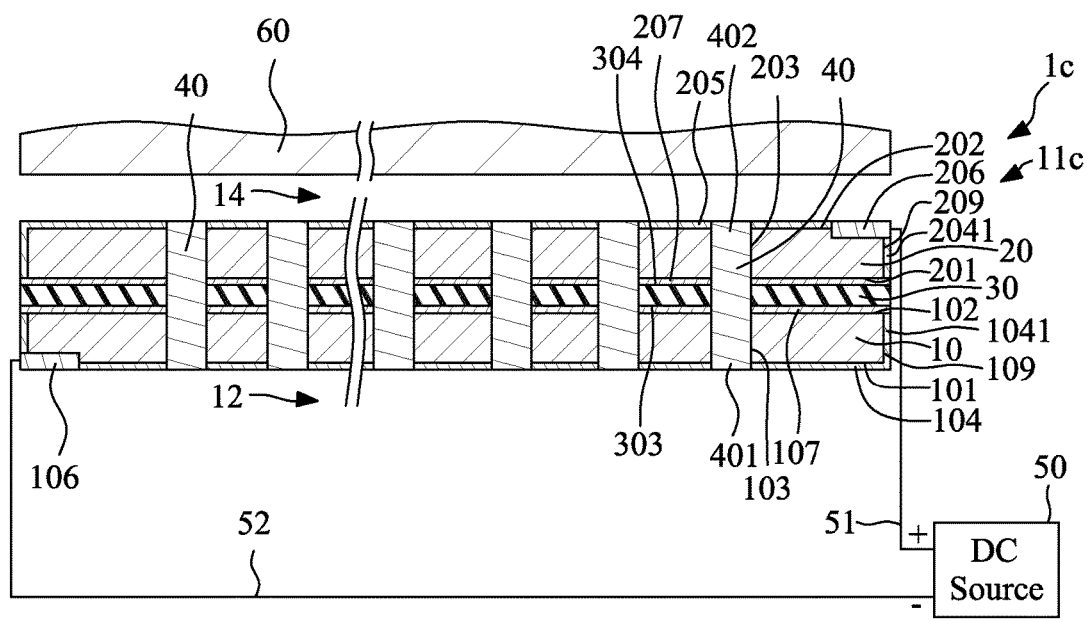
FIG. 5 illustrates a cross-sectional view of a thermoelectric device according to an embodiment of the present disclosure.

FIG. 5 illustrates a cross-sectional view of a thermoelectric device 1c according to an embodiment of the present disclosure. The thermoelectric device 1c is similar in some ways to the thermoelectric device 1 as shown in FIG. 1, but differs at least in the structure of the electronic module 11c. The electronic module 11c is similar to the electronic module 11 as shown in FIG. 1, but differs in at least the following way. The electronic module 11c does not include the second oxide layer 105, the third oxide layer 204 and the adhesion frame 32. Also, the insulation layer 30 of the electronic module 11c is a single layer, and has a first surface 303 and a second surface 304 opposite the first surface 303. Therefore, the second surface 304 of the insulation layer 30 contacts the second coupling agent 207 on the second surface 102 of the first base layer 10, and the first surface 303 of the insulation layer 30 contacts the first coupling agent 107 on the first surface 201 of the second base layer 20. That is, the insulation layer 30 is sandwiched between the first base layer 10 and the second base layer 20. Also, the first electric terminal 106 is disposed adjacent the first surface 101 of the first base layer 10, and the second electric terminal 206 is disposed adjacent to the second surface 202 of the second base layer 20. The materials of the first electric terminal 106 and the second electric terminal 206 may include, for example, copper or solder.

Figure 6:
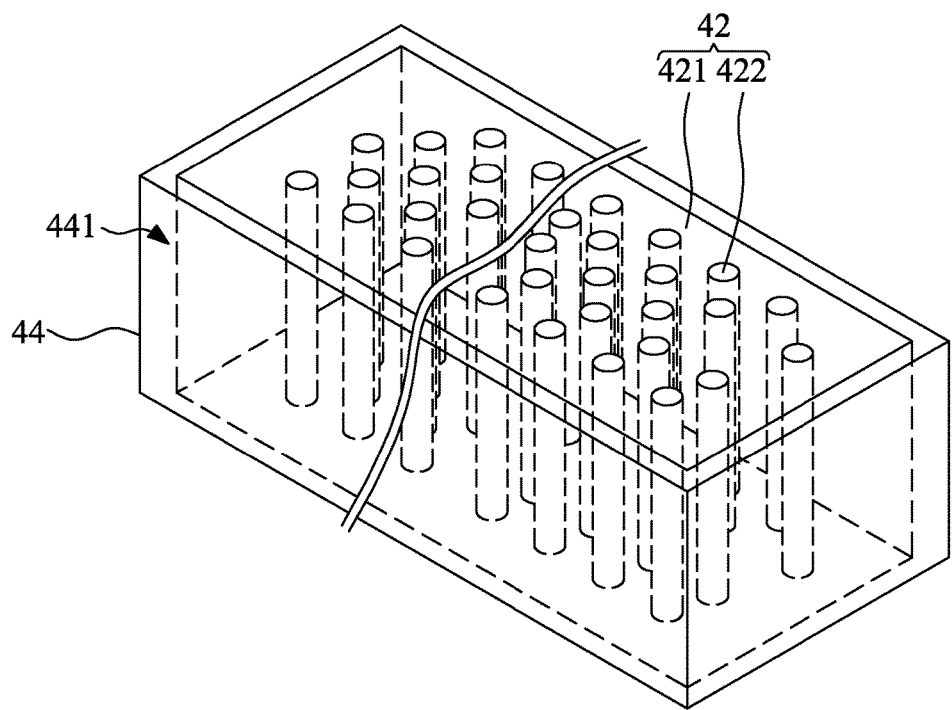
FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18 and FIG. 19 illustrate a method for manufacturing an electronic module according to an embodiment of the present disclosure.

FIGS. 6-19 illustrate a method for manufacturing an electronic module according to an embodiment of the present disclosure. Referring to FIG. 6, a prepreg 42 is provided. The prepreg 42 includes a resin 421 and a plurality of carbon fibers 422 dispersed in the resin 421, wherein the carbon fibers 422 are spaced apart from each other. The prepreg 42 may be formed as follows. The resin 421 is provided into an accommodating space 441 of a tool 44. Then, the carbon fibers 422 are coated with a coupling agent. Then, the carbon fibers 422 are placed in the resin 421, wherein the carbon fibers 422 are spaced apart from each other. That is, the carbon fibers 422 do not contact each other. Then, the resin 421 is cured so as to form the prepreg 42. In at least one embodiment, the diameter of the carbon fiber 422 is in a range of about 7 μm to about 20 μm. It is noted that the sizes and locations of the carbon fibers 422 correspond to the sizes and locations of the first holes 103 of the first base layer 10 and/or the second holes 203 of the second base layer 20. It is noted that the volume of the carbon fibers 422 can be in a range of about 5% to about 40% of the volume of the prepreg 42.

Figure 7:
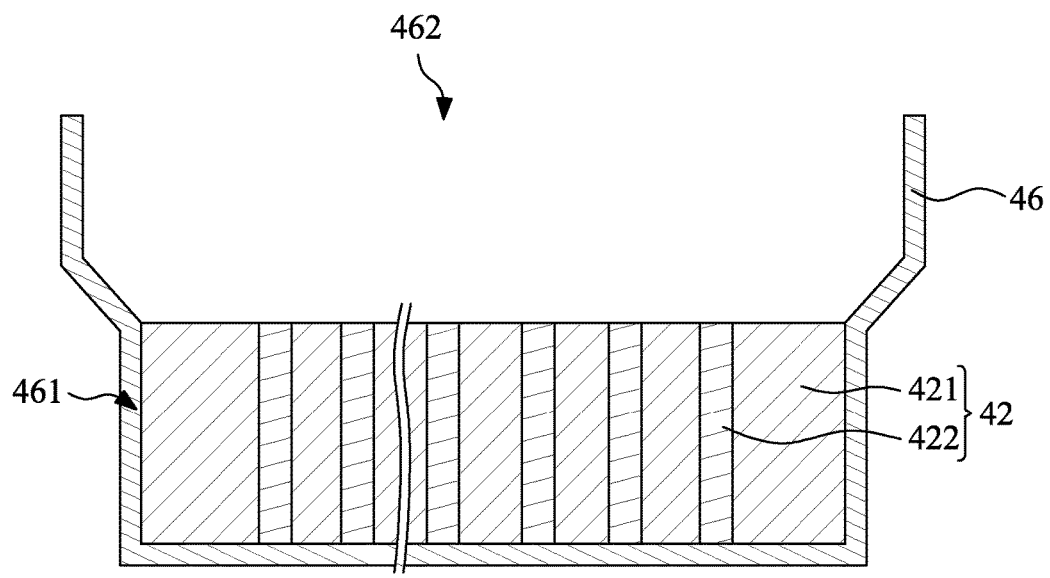

Referring to FIG. 7, a mold 46 is provided. The mold 46 defines a first cavity 461 and a second cavity 462. The first cavity 461 is in liquid communication with the second cavity 462, and the cross-sectional area of the first cavity 461 is smaller than the cross-sectional area of the second cavity 462. Then, the prepreg 42 is placed in the first cavity 461. It is noted that the cross-sectional area of the prepreg 42 is substantially equal to the cross-sectional area of the first cavity 461.

Figure 8:
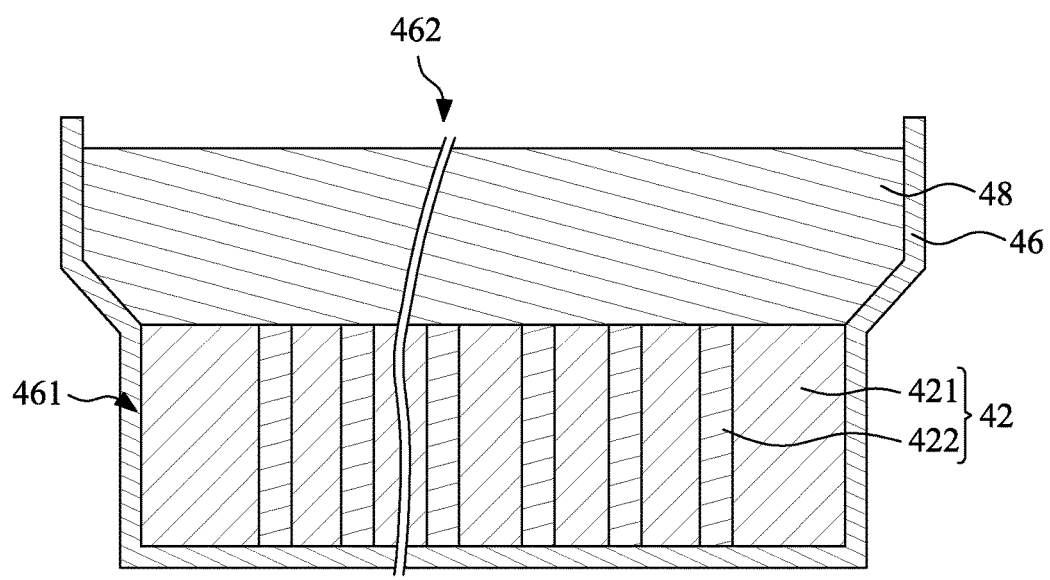

Referring to FIG. 8, a first molten metal 48 is applied into the second cavity 462. In at least one embodiment, the first molten metal 48 may include, for example, molten aluminum, molten copper or other suitable molten metal.

Figure 9:
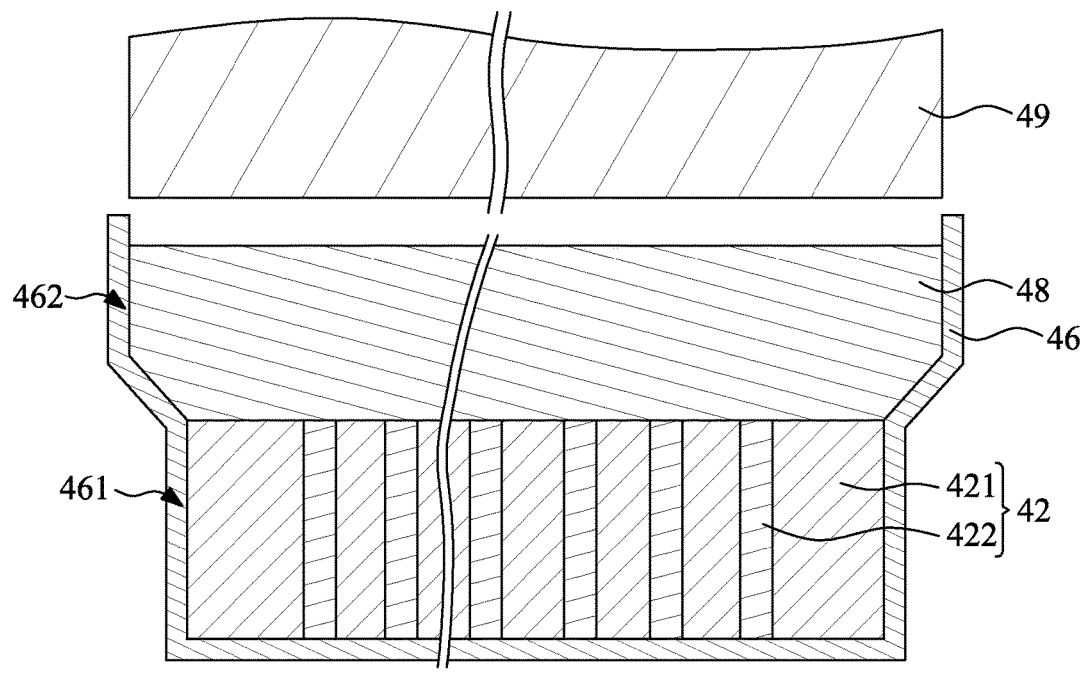

Referring to FIG. 9, a pressing head 49 is applied above the first molten metal 48 in the second cavity 462. It is noted that the cross-sectional area of the pressing head 49 is substantially equal to the cross-sectional area of the second cavity 462. The pressing head 49 is used to enter the second cavity 462 so as to press the first molten metal 48 to enter the first cavity 461.

Figure 10:
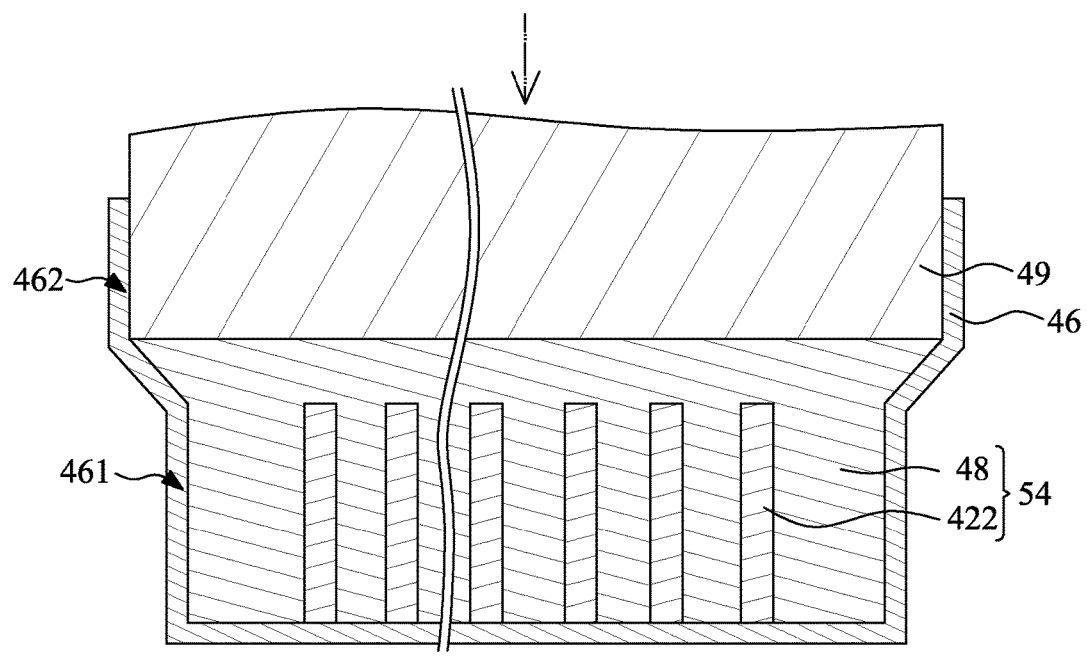

Referring to FIG. 10, the pressing head 49 reaches the bottom of the second cavity 462 under a predetermined pressure. Meanwhile, the resin 421 of the prepreg 42 will be decomposed and gasified by the high-temperature first molten metal 48. That is, the first molten metal 48 enters the first cavity 461 to replace the resin 421 and enclose the carbon fibers 422 so as to form a carbon fibers-first metal composite 54. The carbon fibers-first metal composite 54 is formed by squeeze casting. It is noted that the volume of the first molten metal 48 of FIG. 8 is substantially equal to or greater than the volume of the resin 421 of the prepreg 42.

Figure 11:
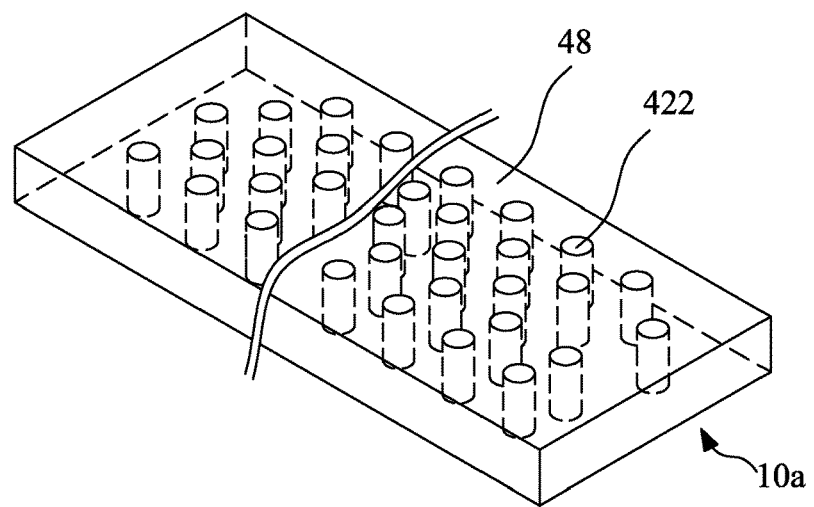

Referring to FIG. 11, the carbon fibers-first metal composite 54 is picked up from the first cavity 461, and is then diced into a plurality of plates 10a. The thickness of the plate 10a is in a range of about 0.1 mm to about 0.5 mm, which is substantially equal to the thickness of the first base layer 10 and/or the second base layer 20.

Figure 12:
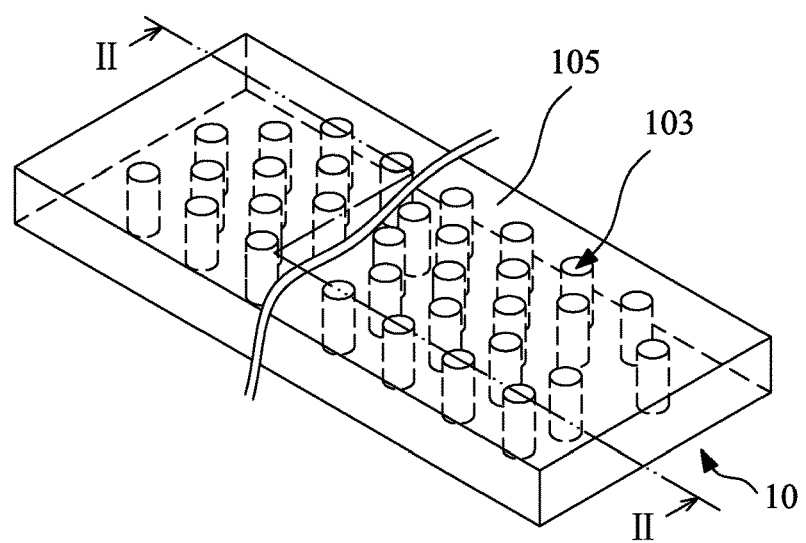
Figure 13:
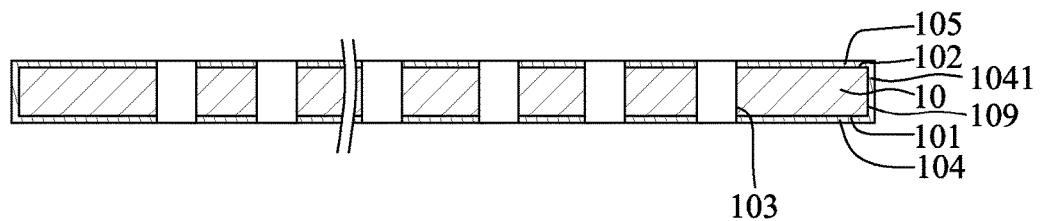

Referring to FIGS. 12 and 13, wherein FIG. 13 is a cross-sectional view taken along line II-II of FIG. 12, a high-temperature oxidation process is conducted with the plate 10a. In at least one embodiment, the plate 10a is placed in a high-temperature oven with oxygen atmosphere. Then, the carbon fibers 422 are moved by oxidation so as to form the first base layer 10 with the first holes 103 extending through the first base layer 10, wherein the first base layer 10 includes the first metal. In at least one embodiment, the diameter of the first hole 103 is in a range of about 7 μm to about 20 μm. Meanwhile, the first oxide layer 104 is formed on the first surface 101 of the first base layer 10, the second oxide layer 105 is formed on the second surface 102 of the first base layer 10 and the side oxide layer 1041 is formed on the side surface 109 of the first base layer 10. The thicknesses of the first oxide layer 104, the second oxide layer 105 and the side oxide layer 1041 may be substantially the same. In at least one embodiment, if there is an oxide layer formed on the inner surface of the first hole 103 of the first base layer 10, a reduction gas (i.e., hydrogen gas) is introduced into the first hole 103, such that the thin oxide layer is reduced to the first metal of the first base layer 10.

Figure 14:
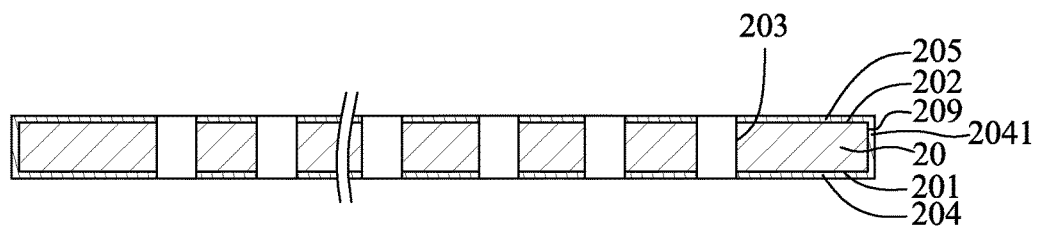

Referring to FIG. 14, it is noted that the plate 10a may be used as the second base layer 20 after the high-temperature oxidation process. The second base layer 20 defines the second holes 203 extending through the second base layer 20, wherein the second base layer 20 includes the second metal. In at least one embodiment, the diameter of the second hole 203 is in a range of about 7 μm to about 20 μm. Meanwhile, the third oxide layer 204 is formed on the first surface 201 of the second base layer 20, the fourth oxide layer 205 is formed on the second surface 202 of the second base layer 20 and the side oxide layer 2041 is formed on the side surface 209 of the second base layer 20. The thicknesses of the third oxide layer 204, the fourth oxide layer 205 and the side oxide layer 2041 may be substantially the same. In at least one embodiment, if there a thin oxide layer is formed on the inner surface of the second hole 203 of the second base layer 20, a reduction gas (i.e., hydrogen gas) is introduced into the second hole 203, such that the thin oxide layer is reduced to the second metal of the second base layer 20.

Figure 15:
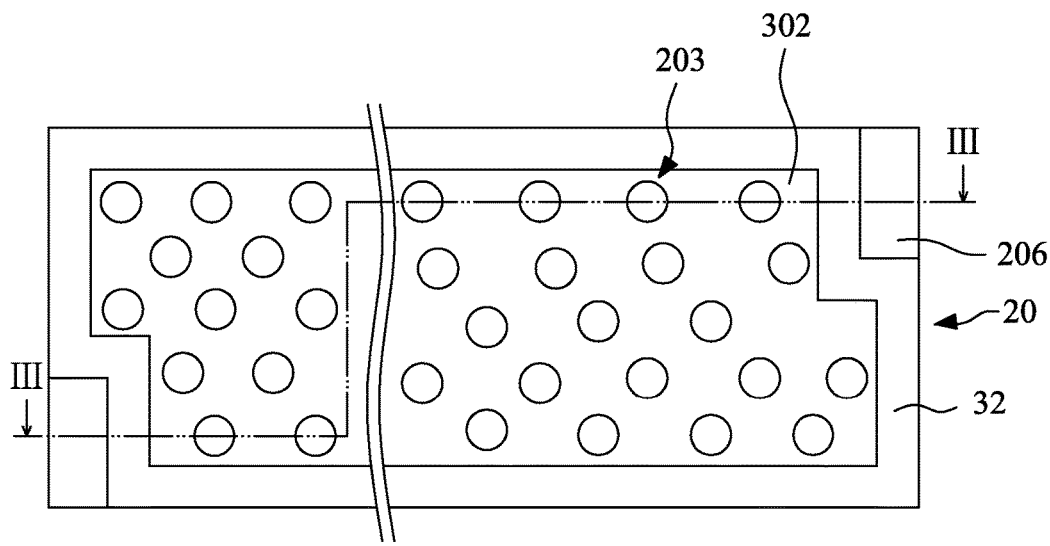
Figure 16:
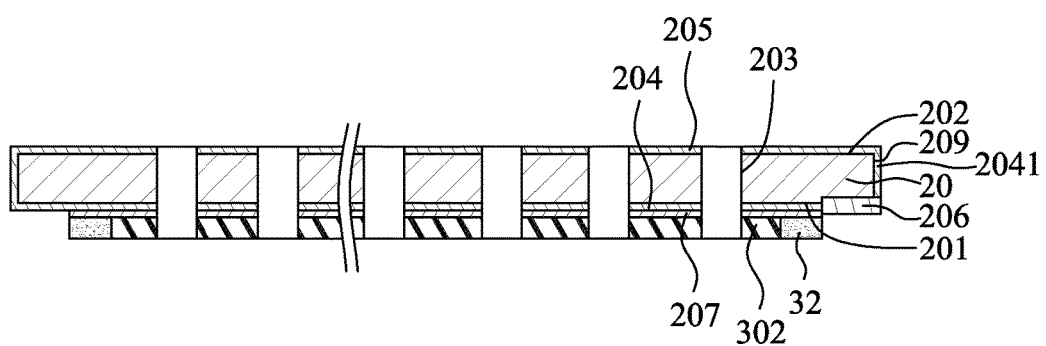

Referring to FIGS. 15 and 16, wherein FIG. 16 is a cross-sectional view taken along line III-III of FIG. 15, the second coupling agent 207, the second insulation layer 302 and the adhesion frame 32 are formed adjacent to the first surface 201 of the second base layer 20. In at least one embodiment, the second coupling agent 207 is formed on the third oxide layer 204 by immersing or spray coating. The material of the second coupling agent 207 may be, for example, siloxane coupling agent or other suitable material. The second coupling agent 207 is used to facilitate bonding between the second insulation layer 302 and the third oxide layer 204. Then, the second insulation layer 302 is formed on the second coupling agent 207. The material of the second insulation layer 302 may be polyimide (PI), polyphenylene oxide (PPO) or other suitable material. The thickness of the second insulation layer 302 may be in a range of about 20 μm to about 100 μm. Then, the second insulation layer 302 is cured. Then, the portions of the second insulation layer 302 that cover the second holes 203 are removed by, for example, etching by using another plate 10a as a mask. In addition, the periphery portion of the second insulation layer 302 is also removed by, for example, etching. Then, a corner portion of the third oxide layer 204 is removed such that the second base layer 20 is exposed, and the second electric terminal 206 is plated on the exposed portion of the second base layer 20 directly. The material of the second electric terminal 206 may be, for example, copper. Then, the adhesion frame 32 is formed on the second coupling agent 207. As shown, in FIG. 15, the adhesion frame 32 is disposed at the periphery of the second base layer 20, surrounds the second insulation layer 302 and does not cover the second electric terminal 206. In other embodiments, the adhesion frame 32 may cover a portion of the second electric terminal 206. In at least one embodiment, the thickness of the adhesion frame 32 is substantially equal to the thickness of the second insulation layer 302. As shown in FIG. 15, the adhesion frame 32 is a continuous loop; however, in other embodiment, the adhesion frame 32 may be discontinuous. In at least one embodiment, the adhesion frame 32 is an ultraviolet (UV) curable adhesive or other suitable material.

Figure 17:
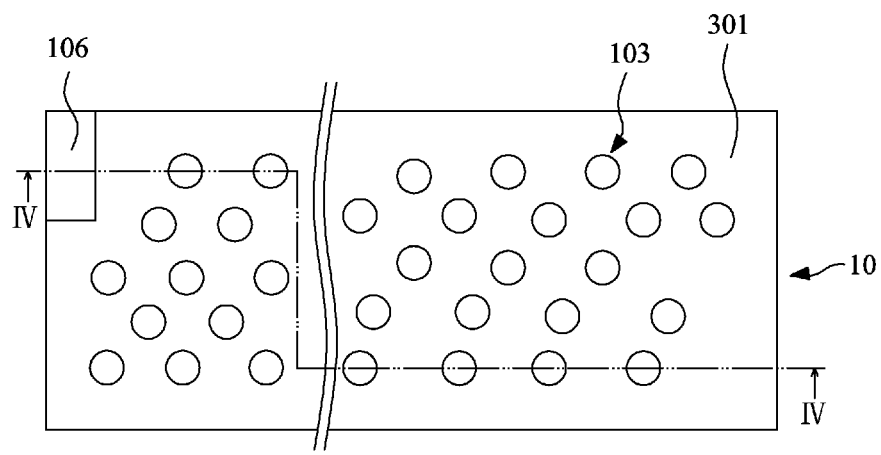
Figure 18:
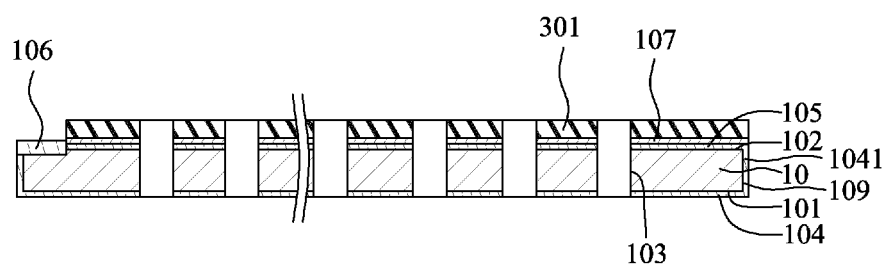

Referring to FIGS. 17 and 18, wherein FIG. 18 is a cross-sectional view taken along line IV-IV of FIG. 17, the first coupling agent 107 and the first insulation layer 301 are formed adjacent to the second surface 102 of the first base layer 10. In at least one embodiment, the first coupling agent 107 is formed on the second oxide layer 105 by immersing or spray coating. The material of the first coupling agent 107 may be, for example, siloxane coupling agent or other suitable material. The first coupling agent 107 is used to facilitate bonding between the first insulation layer 301 and the second oxide layer 105. Then, the first insulation layer 301 is formed on the first coupling agent 107. The material of the first insulation layer 301 may be, for example, polyimide (PI), polyphenylene oxide (PPO) or other suitable material. The thickness of the first insulation layer 301 may be in a range of about 20 μm to about 100 μm. Then, the first insulation layer 301 is cured. Then, the portions of the first insulation layer 301 that cover the first holes 103 are removed by, e.g., etching by using another plate 10a as a mask. In addition, the corner portion of the first insulation layer 301 is also removed by, e.g., etching. Then, a corner portion of the second oxide layer 105 is removed such that the first base layer 10 is exposed, and the first electric terminal 106 is plated on the exposed portion of the first base layer 10 directly. The material of the first electric terminal 106 may be, for example, copper.

Figure 19:
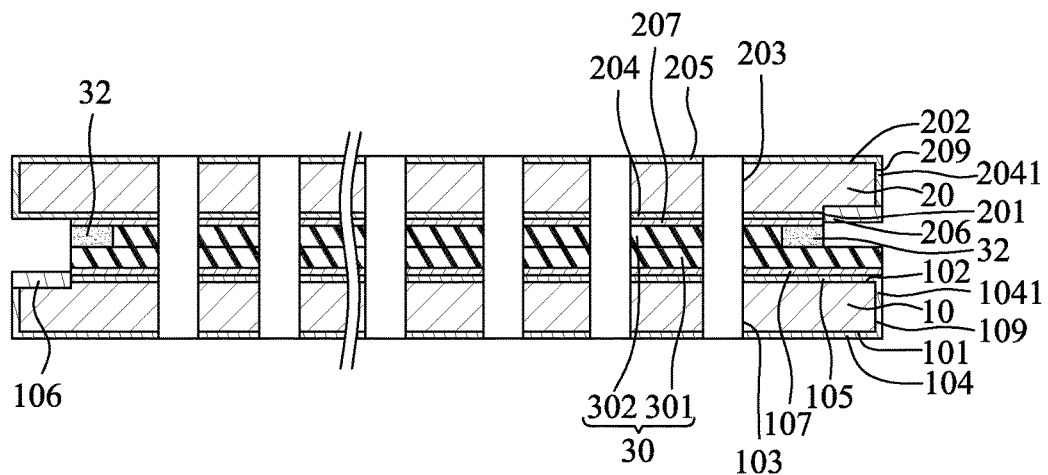

Referring to FIG. 19, the first base layer 10 is attached to the second base layer 20. The second base layer 20 is electrically insulated from the first base layer 10 by the first insulation layer 301 and the second insulation layer 302. The adhesion frame 32 is adhered to the first insulation layer 301. The first holes 103 are aligned with the second holes 204. Then, an ultraviolet (UV) light is applied to the adhesion frame 32 and cures the adhesion frame 32.

Then, the via 40 is formed in the first hole 103 of the first base layer 10 and in the second hole 203 of the second base layer 20 such that the via 40 contacts the first base layer 10 and the second base layer 20 so as to obtain the electronic module 11 of the thermoelectric device 1 of FIGS. 1 and 2. In at least one embodiment, the via 40 is formed by filling the first hole 103 of the first base layer 10 and the second hole 203 of the second base layer 20 with a thermoelectric material. A value of Z×T for the thermoelectric material is greater than a value of Z×T for the first metal of the first base layer 10 and the second metal of the second base layer 20, wherein Z is a thermoelectric figure of merit, T is temperature (in K). Further, the value of Z×T for the thermoelectric material is greater than about 0.5. In at least one embodiment, the thermoelectric material is, for example, $Na_xCo_2O_4$, $ZrNiSn$, $Bi_2Sr_2Co_2O_y$, $Ca_2Co_2O_5$, $Ca_3Co_4O_9$, $Bi_xSb_{2-x}Te_3$, a MgAgSb based material, $CsBi_4Te_4$ or other suitable material. It is noted that the value of Z×T for the thermoelectric material can be greater than about five times, about seven times, about ten times, or a greater number times the value of Z×T for the first metal of the first base layer 10 and the second metal of the second base layer 20. The value of Z×T for the thermoelectric material can be high, such that the thermoelectric material can exhibit a significant thermoelectric effect.

In at least one embodiment, the via 40 is formed by filling the first hole 103 of the first base layer 10 and the second hole 203 of the second base layer 20 with an inner material such as $Na_xCo_2$. During the filling process, an oxygen gas is applied and oxidizes the inner material to become the thermoelectric material such as $Na_xCo_2O_4$, thus forming the via 40.

Figure 20:
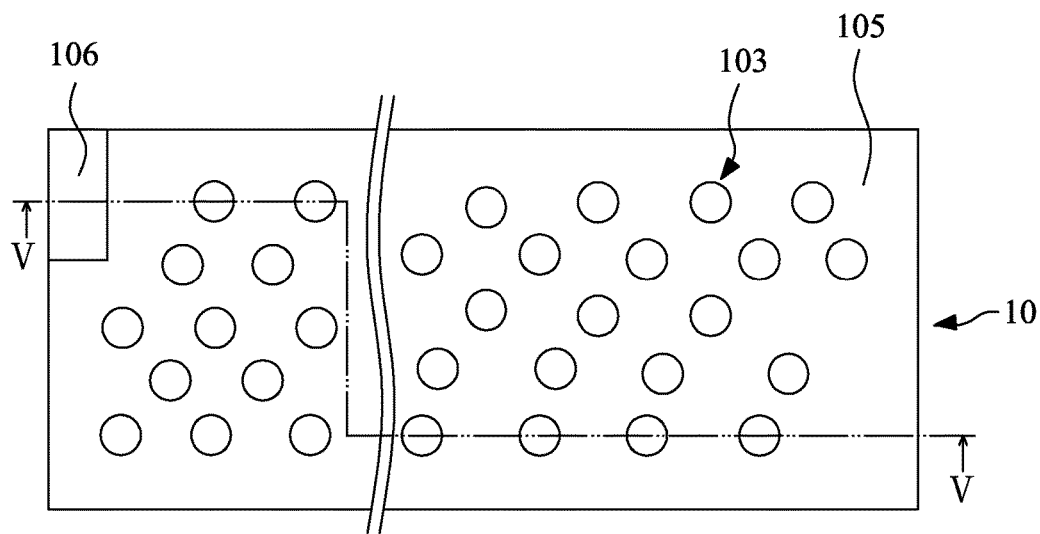
FIG. 20, FIG. 21 and FIG. 22 illustrate a method for manufacturing an electronic module according to an embodiment of the present disclosure.
Figure 21:
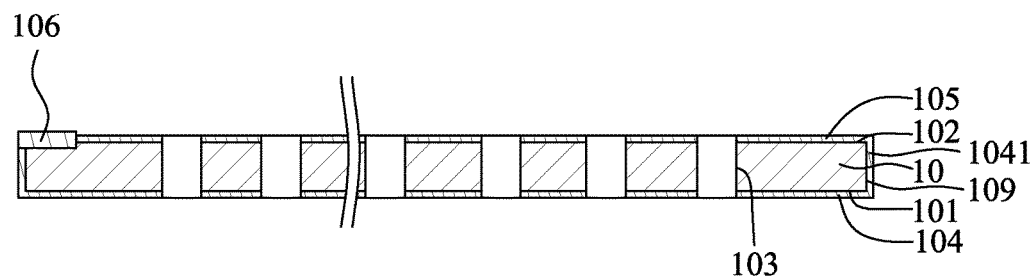
Figure 22:
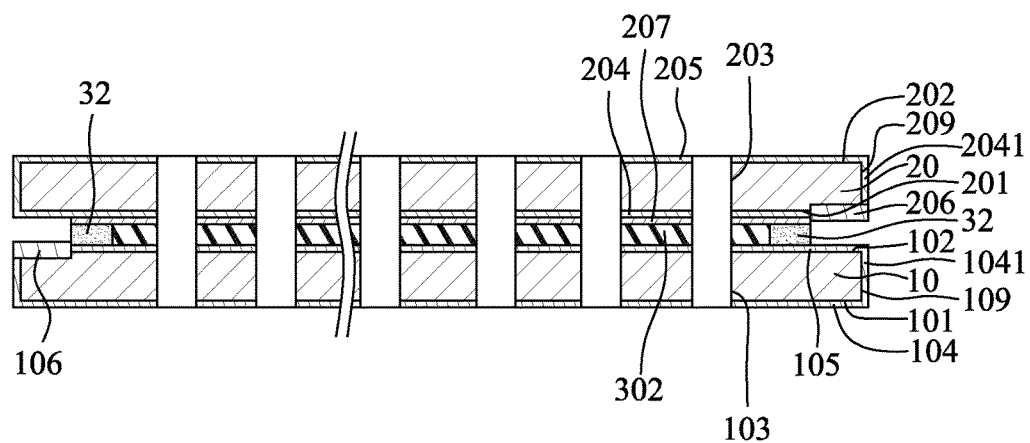

FIGS. 20 to 22 illustrate a method for manufacturing an electronic module according to an embodiment of the present disclosure. The initial steps of this embodiment are similar in some ways to the steps illustrated in FIGS. 6 to 16, and FIG. 20 of this embodiment is subsequent to FIG. 16. Referring to FIGS. 20 and 21, wherein FIG. 21 is a cross-sectional view taken along line V-V of FIG. 20, there are no first coupling agent 107 and first insulation layer 301 formed adjacent to the second surface 102 of the first base layer 10.

Referring to FIG. 22, the first base layer 10 is attached to the second base layer 20. The second base layer 20 is electrically insulated from the first base layer 10 by the second insulation layer 302. The second insulation layer 302 contacts the second oxide layer 105, and the adhesion frame 32 is adhered to the second oxide layer 105 directly. The first holes 103 are aligned with the second holes 204. Then, an ultraviolet (UV) light is applied to the adhesion frame 32 and cures the adhesion frame 32.

Then, the via 40 is formed in the first hole 103 of the first base layer 10 and in the second hole 203 of the second base layer 20 such that the via 40 contacts the first base layer 10 and the second base layer 20 so as to obtain the electronic module 11a of the thermoelectric device 1a of FIG. 3.

Figure 23:
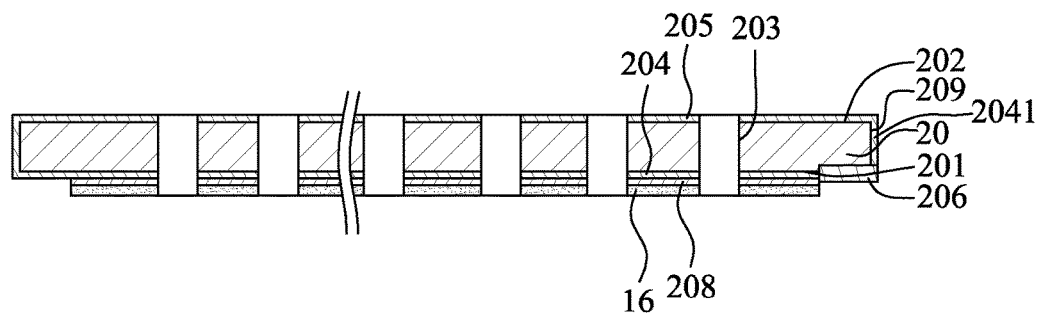
FIG. 23, FIG. 24 and FIG. 25 illustrate a method for manufacturing an electronic module according to an embodiment of the present disclosure.
Figure 24:
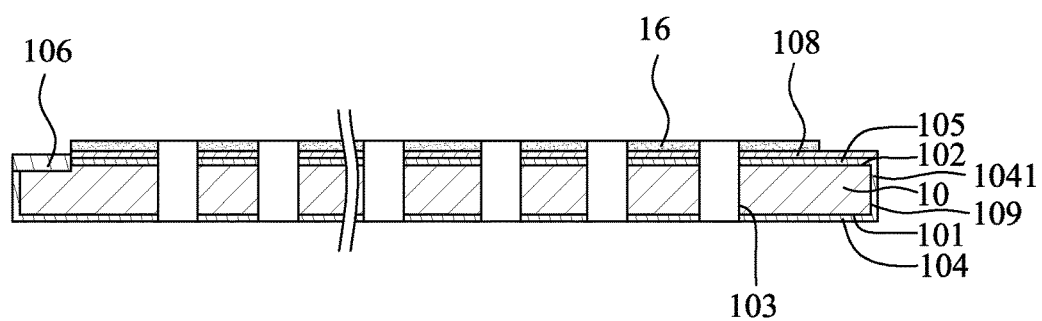
Figure 25:
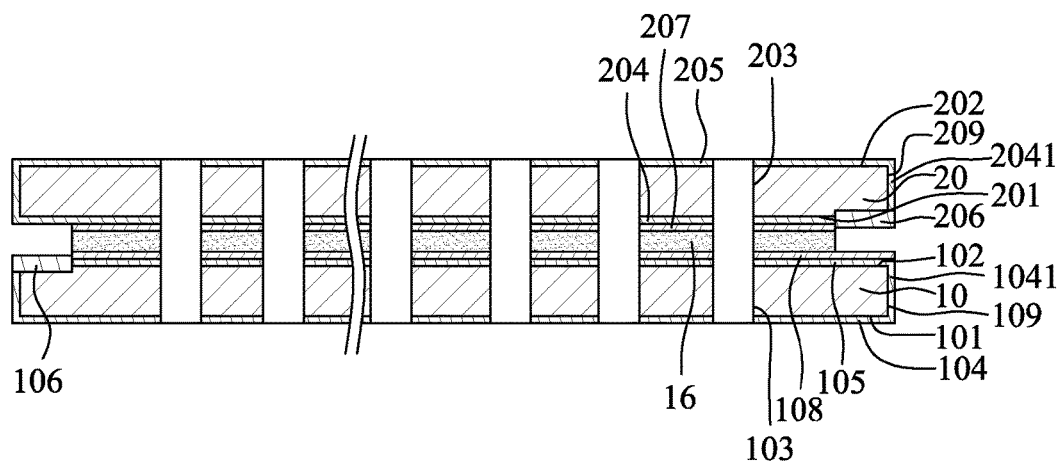

FIGS. 23 to 25 illustrate a method for manufacturing an electronic module according to an embodiment of the present disclosure. The initial steps of this embodiment are similar in some ways to the steps illustrated in FIGS. 6 to 14, and FIG. 23 of this embodiment is subsequent to FIG. 14. Referring to FIG. 23, the second dielectric layer 208, the adhesion layer 16 and the second electric terminal 206 are formed adjacent to the first surface 201 of the second base layer 20. As shown in FIG. 23, the second dielectric layer 208 is disposed on the third oxide layer 204 by low-temperature sputtering. The material of the second dielectric layer 208 may be silicon carbide (SiC) or other suitable material. The thickness of the second dielectric layer 208 may be in a range of about 10 µm to about 20 µm. Then, the portions of the second dielectric layer 208 that cover the second holes 203 are removed by, for example, etching by using another plate 10a as a mask. In addition, a corner portion of the third oxide layer 204 and a corner portion of the second dielectric layer 208 are removed such that the second base layer 20 is exposed, and the second electric terminal 206 is plated on the exposed portion of the second base layer 20 directly. Then, the adhesion layer 16 is formed on the second dielectric layer 208. The material of the adhesion layer 16 may be a coupling agent (e.g., siloxane coupling agent) or other suitable material. In at least one embodiment, the adhesion layer 16 may cover the second electric terminal 206.

Referring to FIG. 24, the first dielectric layer 108 and the first electric terminal 106 are formed adjacent to the second surface 102 of the first base layer 10. As shown in FIG. 24, the first dielectric layer 108 is disposed on the second oxide layer 105 by low-temperature sputtering. The material of the first dielectric layer 108 is, for example, silicon carbide (SiC) or other suitable material. The material of the first dielectric layer 108 may be the same as or different from the material of the second dielectric layer 208. The thickness of the first dielectric layer 108 may be in a range of about 10 µm to about 20 µm. Then, the portions of the first dielectric layer 108 that cover the first holes 103 are removed by, for example, etching by using another plate 10a as a mask. In addition, a corner portion of the second oxide layer 105 and a corner portion of the first dielectric layer 108 are removed such that the first base layer 10 is exposed, and the first electric terminal 106 is plated on the exposed portion of the first base layer 10 directly.

Referring to FIG. 25, the first base layer 10 is attached to the second base layer 20. The second base layer 20 is electrically insulated from the first base layer 10 by the first dielectric layer 108 and the second dielectric layer 208. The first dielectric layer 108 is bonded to the second dielectric layer 208 by the adhesion layer 16. That is, the adhesion layer 16 is sandwiched between the first dielectric layer 108 and the second dielectric layer 208. The first holes 103 are aligned with the second holes 204.

Then, the via 40 is formed in the first hole 103 of the first base layer 10 and in the second hole 203 of the second base layer 20 such that the via 40 contacts the first base layer 10 and the second base layer 20 so as to obtain the electronic module 11b of the thermoelectric device 1b of FIG. 4.

Figure 26:
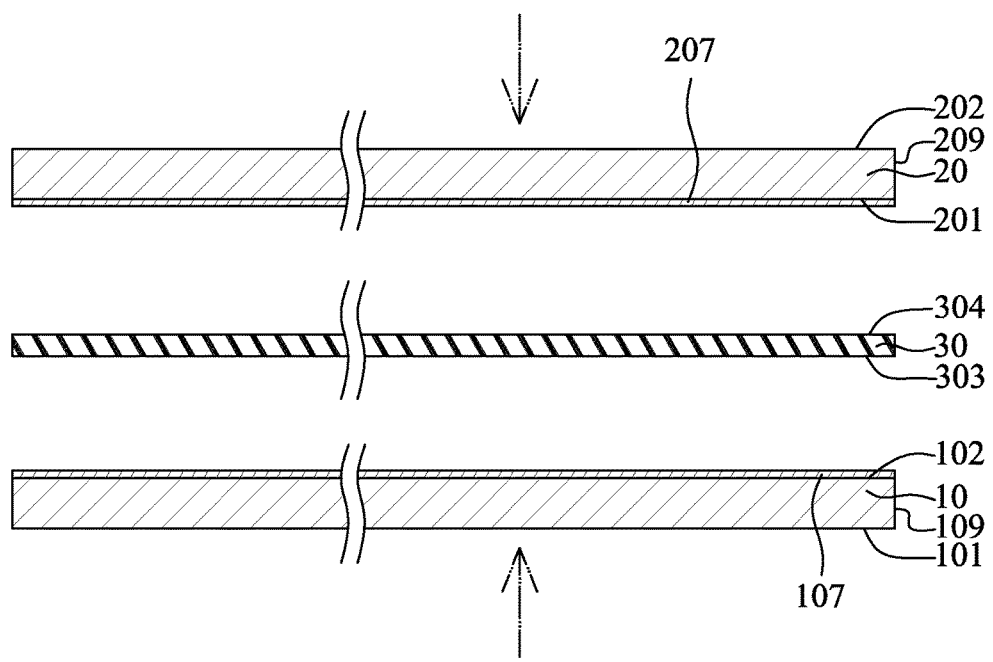
FIG. 26, FIG. 27 and FIG. 28 illustrate a method for manufacturing an electronic module according to an embodiment of the present disclosure.
Figure 27:
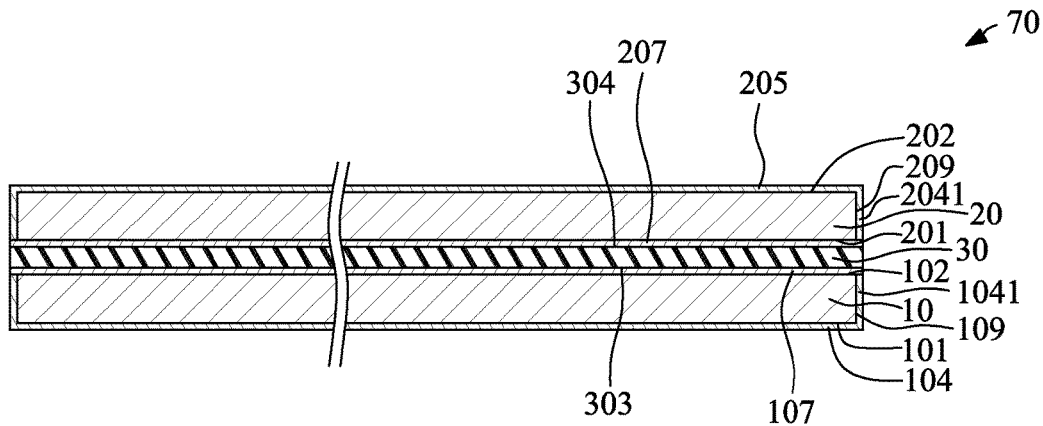
Figure 28:
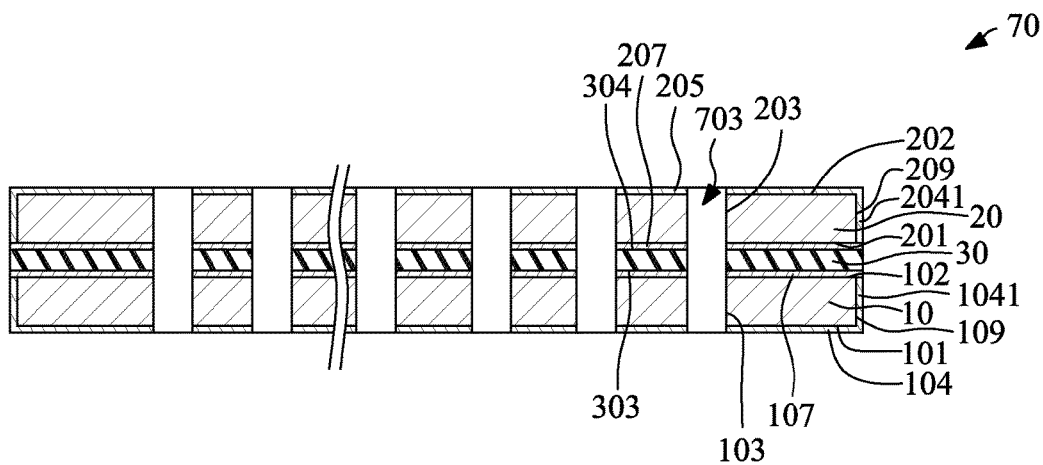

FIGS. 26 to 28 illustrate a method for manufacturing an electronic module according to an embodiment of the present disclosure. Referring to FIG. 26, the first base layer 10 and the second base layer 20 are formed as follows. A first metal foil and a second metal foil are provided. The surfaces of the first metal foil and the second metal foil are roughened by using an alkali solution. Then, the first metal foil and the second metal foil are soaked in an acidic solution to conduct a neutralization reaction. Then, the first metal foil and the second metal foil are dried to form the first base layer 10 and the second base layer 20, respectively. Then, the first coupling agent 107 is formed on the second surface 102 of the first base layer 10, and the second coupling agent 207 is formed on the first surface 201 of the second base layer 20. Further, the insulation layer 30 is provided. The insulation layer 30 a single layer, and has a first surface 303 and a second surface 304 opposite the first surface 303.

Referring to FIG. 27, the first base layer 10 and the second base layer 20 are attached to the first surface 303 and the second surface 304 of the insulation layer 30, respectively, by compressed by rollers and form a sandwich structure 70. Therefore, the second surface 304 of the insulation layer 30 contacts the second coupling agent 207 on the second surface 102 of the first base layer 10, and the first surface 303 of the insulation layer 30 contacts the first coupling agent 107 on the first surface 201 of the second base layer 20. That is, the insulation layer 30 is sandwiched between the first base layer 10 and the second base layer 20. In at least one embodiment, the sandwich structure 70 is placed in an oven set to a predetermined temperature so that the insulation layer 30 will react with the first coupling agent 107 and the second coupling agent 207, and the stress of the sandwich structure 70 will be released. Meanwhile, the first oxide layer 104 is formed on the first surface 101 of the first base layer 10, and the side oxide layer 1041 is formed on the side surface 109 of the first base layer 10. Further, the fourth oxide layer 205 is formed on the second surface 202 of the second base layer 20, and the side oxide layer 2041 is formed on the side surface 209 of the second base layer 20.

Referring to FIG. 28, a plurality of through holes 703 are formed in the sandwich structure 70 to extend through the sandwich structure 70. Each of the through holes 703 includes the first hole 103 in the first base layer 10 and the second hole 203 in the second base layer 20. In at least one embodiment, the through holes 703 are formed by laser drilling according to a predetermined diameter and pitch. The diameter of the through hole 703 may be in a range of about 30 µm to about 120 µm.

Then, the via 40 is formed in the through hole 703 so that the via 40 contacts the first base layer 10 and the second base layer 20. Then, a corner portion of the first oxide layer 104 and a corner of the fourth oxide layer 205 are removed by, for example, grinding. Then, the first electric terminal 106 is formed on the exposed first surface 101 of the first base layer 10, and the second electric terminal 206 is formed on the exposed second surface 202 of the second base layer 20 so as to obtain the electronic module 11c of the thermoelectric device 1c of FIG. 5. The materials of the first electric terminal 106 and the second electric terminal 206 may be, for example, copper or solder.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A thermoelectric module, comprising:
   a first base layer having a first surface and a second surface opposite the first surface, and defining a plurality of first holes, wherein the first base layer includes a first metal, and the first base layer is continuous and is a monolithic structure, and each of the first holes extends through the first base layer;
   a plurality of vias each disposed in respective ones of the first holes of the first base layer, wherein the vias include a thermoelectric material, and each of the vias extends through the first base layer; and
   a second base layer having a first surface and a second surface opposite to the first surface of the second base layer, and defining a plurality of second holes,
   wherein the second base layer includes a second metal, the first surface of the second base layer faces the second surface of the first base layer, the second base layer is electrically insulated from the first base layer, the second base layer is continuous and is a monolithic structure, and each of the vias is further disposed in respective ones of the second holes of the second base layer.

2. The thermoelectric module according to claim 1, further comprising:
   a first oxide layer disposed on the first surface of the first base layer; and
   a second oxide layer disposed on the second surface of the first base layer.

3. The thermoelectric module according to claim 1, wherein the vias contact the first base layer directly, and the vias are electrically connected to the first base layer.

4. The electronic module according to claim 1, wherein first metal is copper or aluminum, and the thermoelectric material is at least one of sodium cobaltate, ZrNiSn, bismuth strontium cobalt oxide, $Ca_2Co_2O_5$, $Ca_3Co_4O_9$, bismuth antimony telluride, a MgAgSb based material, or $CsBi_4Te_4$.

5. The thermoelectric module according to claim 1, wherein the second metal is the same as the first metal.

6. The thermoelectric module according to claim 1, further comprising:
   an insulation layer disposed between the first base layer and the second base layer.

7. The thermoelectric module according to claim 6, further comprising:
   an adhesion frame disposed between the first base layer and the second base layer and surrounding the insulation layer.

8. The thermoelectric module according to claim 1, further comprising:
   a first electric terminal disposed on the first base layer; and
   a second electric terminal disposed on the second base layer.

9. The thermoelectric module according to claim 8, wherein the first electric terminal is disposed adjacent to the second surface of the first base layer, and the second electric terminal is disposed adjacent to the first surface of the second base layer.

10. The thermoelectric module according to claim 9, further comprising:
    an insulation layer disposed between the first base layer and the second base layer, wherein the insulation layer exposes the first electric terminal or the second electric terminal.

11. The thermoelectric module according to claim 8, wherein the first electric terminal is disposed adjacent to the first surface of the first base layer, and the second electric terminal is disposed adjacent to the second surface of the second base layer.

12. The thermoelectric module according to claim 1, further comprising:
    a first oxide layer disposed on the first surface of the second base layer; and
    a second oxide layer disposed on the second surface of the second base layer, wherein the vias contact the second base layer directly, and the vias are electrically connected to the second base layer.

13. The thermoelectric module according to claim 1, wherein a value of Z×T for the thermoelectric material is greater than a value of Z×T for the first metal, wherein Z is a thermoelectric figure of merit, T is temperature in Kelvin, and the value of Z×T for the thermoelectric material is greater than 0.5.

14. A thermoelectric device, comprising:
    a direct current voltage source including a positive connection and a negative connection;
    a first base layer electrically connected to the negative connection of the direct current voltage source, wherein the first base layer has a first surface and a second surface opposite the first surface, and defines at least one first hole extending through the first base layer, and the first base layer includes a first metal;
    a second base layer electrically connected to the positive connection of the direct current voltage source;
    a first oxide layer disposed on the first surface of the first base layer;
    a second oxide layer disposed on the second surface of the first base layer; and
    at least one via having a first end disposed in the at least one first hole of the first base layer and a second end contacting the second base layer, wherein the at least one via extends through the first base layer and includes a thermoelectric material, a value of Z×T for the thermoelectric material is greater than a value of Z×T for the first metal, and the value of Z×T for the thermoelectric material is greater than 0.5, wherein Z is a thermoelectric figure of merit, and T is temperature in Kelvin, and wherein the at least one via is configured to absorb heat at the second end and transmit the heat through the first end.

15. The thermoelectric device according to claim 14, wherein the second base layer defines at least one second hole, and the second end of the at least one via is disposed in the at least one second hole of the second base layer.

16. The thermoelectric device according to claim 14, wherein a first surface of the second base layer faces the second surface of the first base layer, and the thermoelectric device further comprises:
    an insulation layer disposed between the first base layer and the second base layer; and
    an electrical element disposed adjacent to a second surface of the second base layer or the first surface of the first base layer.

17. The thermoelectric device according to claim 14, wherein the at least one via contacts the first base layer and the second base layer directly, and the at least one via is electrically connected to the first base layer and the second base layer.

18. The thermoelectric device according to claim 14, wherein the thermoelectric material is at least one of sodium cobaltate, ZrNiSn, bismuth strontium cobalt oxide, , $Ca_2Co_2O_5$, $Ca_3Co_4O_9$, bismuth antimony telluride, an MgAgSb based material, or $CsBi_4Te_4$.

19. The thermoelectric device according to claim 14, further comprising:
    a first electric terminal disposed on the first base layer; and
    a second electric terminal disposed on the second base layer.

* * * * *